(12) United States Patent
Toyoda et al.

(10) Patent No.: US 9,770,786 B2
(45) Date of Patent: Sep. 26, 2017

(54) LEAD-FREE SOLDER PASTE

(75) Inventors: Yoshitaka Toyoda, Satte (JP);
Fumihiro Imai, Iruma (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 582 days.

(21) Appl. No.: 13/261,530

(22) PCT Filed: Jun. 1, 2010

(86) PCT No.: PCT/JP2010/059274
§ 371 (c)(1),
(2), (4) Date: Dec. 28, 2012

(87) PCT Pub. No.: WO2011/151894
PCT Pub. Date: Dec. 8, 2011

(65) Prior Publication Data
US 2013/0098506 A1    Apr. 25, 2013

(51) Int. Cl.
*B23K 35/02*    (2006.01)
*B23K 35/24*    (2006.01)
(Continued)

(52) U.S. Cl.
CPC ........ *B23K 35/025* (2013.01); *B23K 35/0244* (2013.01); *B23K 35/262* (2013.01);
(Continued)

(58) Field of Classification Search
CPC .................. B23K 35/0244; B23K 35/025; B23K 35/262; H05K 3/3463; H05K 3/3489
See application file for complete search history.

(56) References Cited

U.S. PATENT DOCUMENTS 2,700,628 A * 1/1955 De Rosa ............ B23K 35/3612
148/23
7,669,752 B2 * 3/2010 Ikeda ................... H05K 3/3489
228/180.21
(Continued)

FOREIGN PATENT DOCUMENTS

JP    550286    3/1993
JP    871786    3/1996
(Continued)

OTHER PUBLICATIONS

Hwa-Teng Lee, Heng-Sheng Lin, Cheng-Shyan Lee, Po-Wei Chen, Reliability of Sn—Ag—Sb lead-free solder joints, Materials Science and Engineering: A, vol. 407, Issues 1-2, Oct. 25, 2005, pp. 36-44.*

(Continued)

*Primary Examiner* — Colleen Dunn
*Assistant Examiner* — Jeremy Jones
(74) *Attorney, Agent, or Firm* — Michael Tobias

(57) ABSTRACT

As electronic equipment has become smaller in size, printed circuit boards which cannot be subjected to cleaning have been developed, and a no-clean lead-free solder paste is becoming necessary. In order for a solder paste not to require cleaning, it is necessary that the color of the residue be transparent and that the residue be non-tacky. A maleated rosin, which is a rosin suited for no-clean paste, has a high acid value so it is not suitable for a flux for lead-free solder. As a means of suppressing a reaction between a flux containing a maleated rosin and a Sn—Ag—Cu based solder alloy powder, a Sn—Ag—Cu—Sb based solder alloy powder is used which adds 1-8 mass % of Sb to a Sn—Ag—Cu based solder alloy. As a result, it is possible to provide a solder paste which has the excellent effect that the solder (Continued)

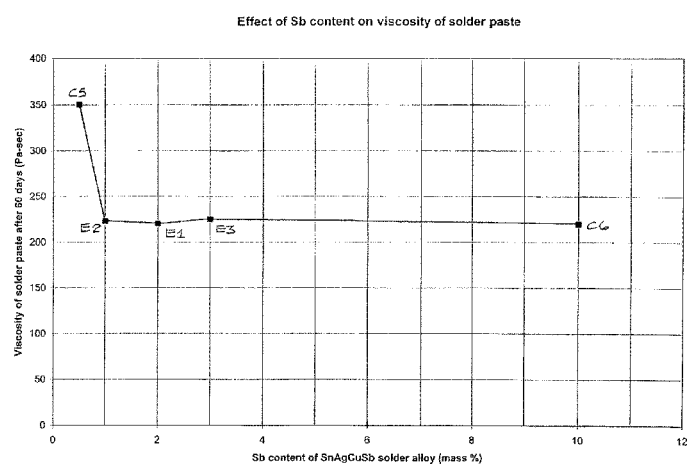

paste does not easily undergo changes over time and has a long pot life.

9 Claims, 4 Drawing Sheets

(51) Int. Cl.
    *B23K 35/26*     (2006.01)
    *B23K 35/36*     (2006.01)
    *B23K 35/365*     (2006.01)
    *C22C 13/00*     (2006.01)
    *C22C 13/02*     (2006.01)
    *H05K 3/34*     (2006.01)

(52) U.S. Cl.
    CPC ........ *B23K 35/365* (2013.01); *B23K 35/3612* (2013.01); *B23K 35/3613* (2013.01); *B23K 35/3616* (2013.01); *B23K 35/3618* (2013.01); *C22C 13/00* (2013.01); *C22C 13/02* (2013.01); *H05K 3/3463* (2013.01); *H05K 3/3484* (2013.01); *H05K 3/3489* (2013.01)

(56) References Cited

U.S. PATENT DOCUMENTS

| | | | | |
|---|---|---|---|---|
| 2001/0020744 | A1* | 9/2001 | Kuramoto | B23K 3/0623 257/738 |
| 2003/0021718 | A1* | 1/2003 | Munekata | B23K 1/0016 420/560 |
| 2003/0183674 | A1* | 10/2003 | Wu | B23K 35/262 228/56.3 |
| 2004/0211291 | A1* | 10/2004 | Ono | B22F 9/06 75/331 |
| 2005/0056687 | A1* | 3/2005 | Matsumoto | B23K 35/025 228/248.1 |
| 2005/0217757 | A1* | 10/2005 | Miyano | B23K 35/34 148/24 |
| 2006/0141683 | A1* | 6/2006 | Inoue | H01L 29/66757 438/149 |
| 2006/0263234 | A1* | 11/2006 | Seelig | B23K 35/0244 420/561 |
| 2008/0035710 | A1* | 2/2008 | Furuno | B23K 35/0244 228/223 |
| 2010/0038411 | A1* | 2/2010 | Shoji | H05K 3/3484 228/223 |

FOREIGN PATENT DOCUMENTS

| | | |
|---|---|---|
| JP | 952191 | 2/1997 |
| JP | 10286689 | 10/1998 |
| JP | 11291083 | 10/1999 |
| JP | 2006167802 A * | 6/2006 |
| JP | 2009231581 | 10/2009 |

OTHER PUBLICATIONS

Humpston, Giles Jacobson, David M.. (2004). Principles of Soldering—3.2 Chemical Fluxes for Soldering. ASM International.*

* cited by examiner

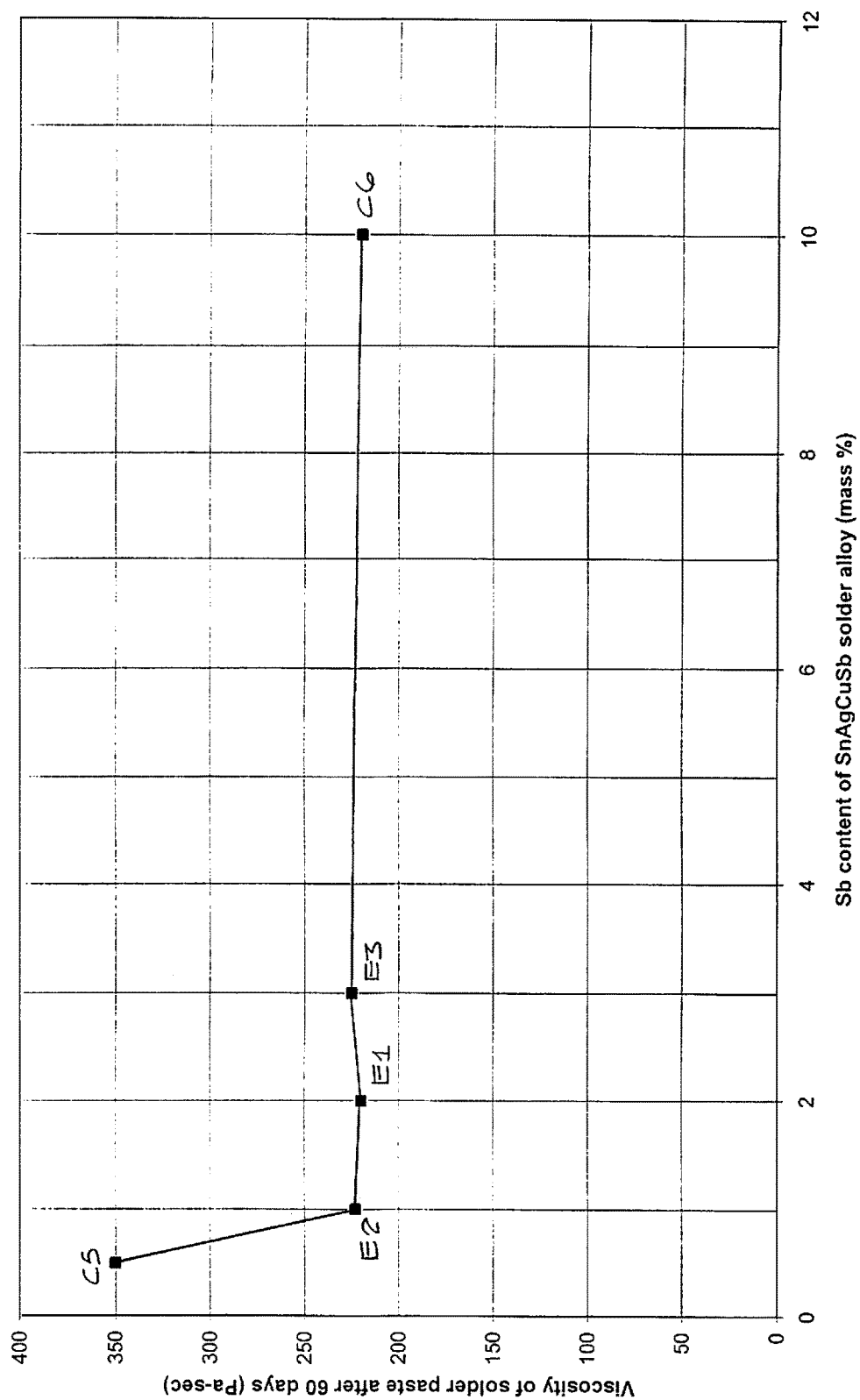

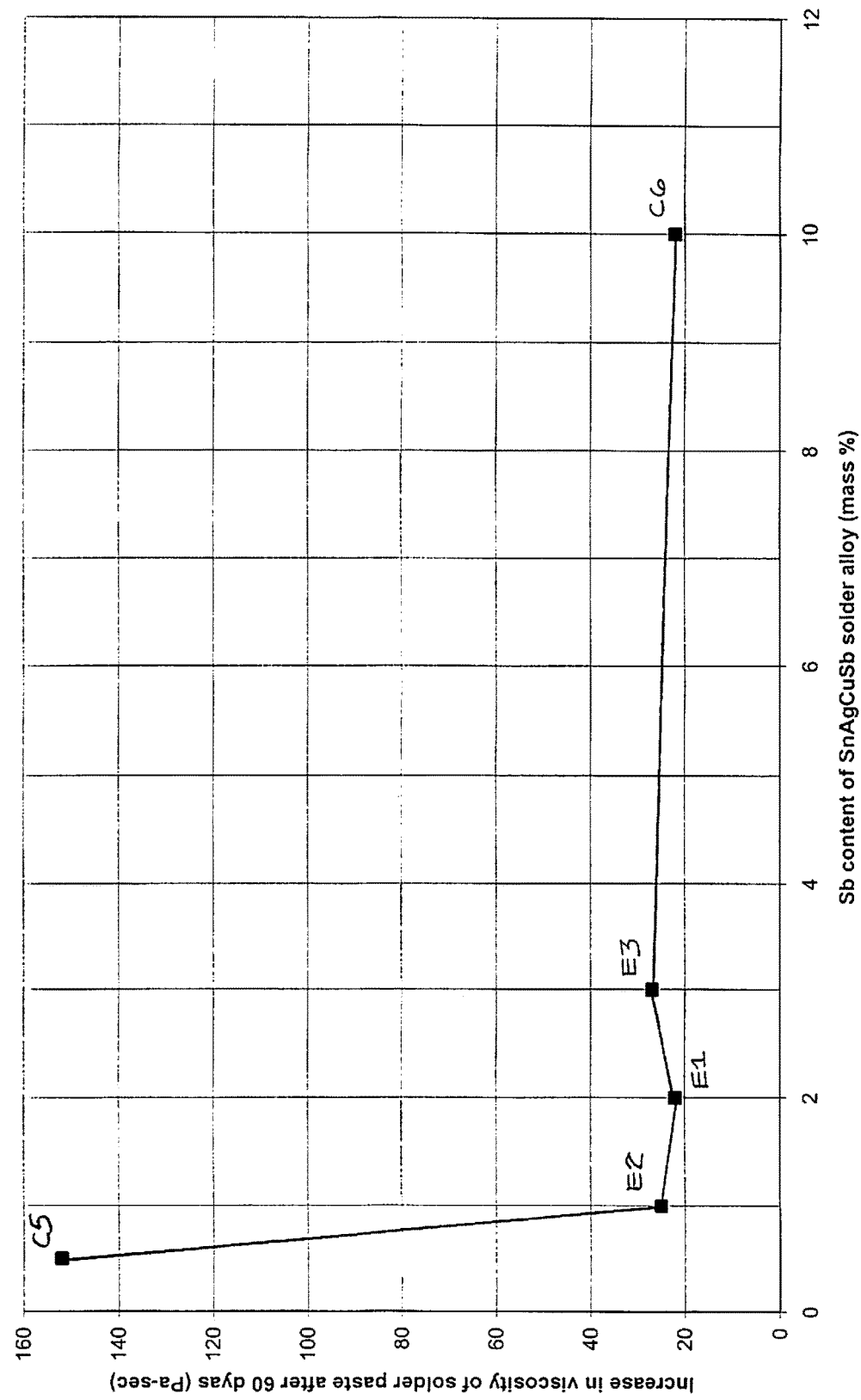
Figure 2 - Effect of Sb content on viscosity of solder paste

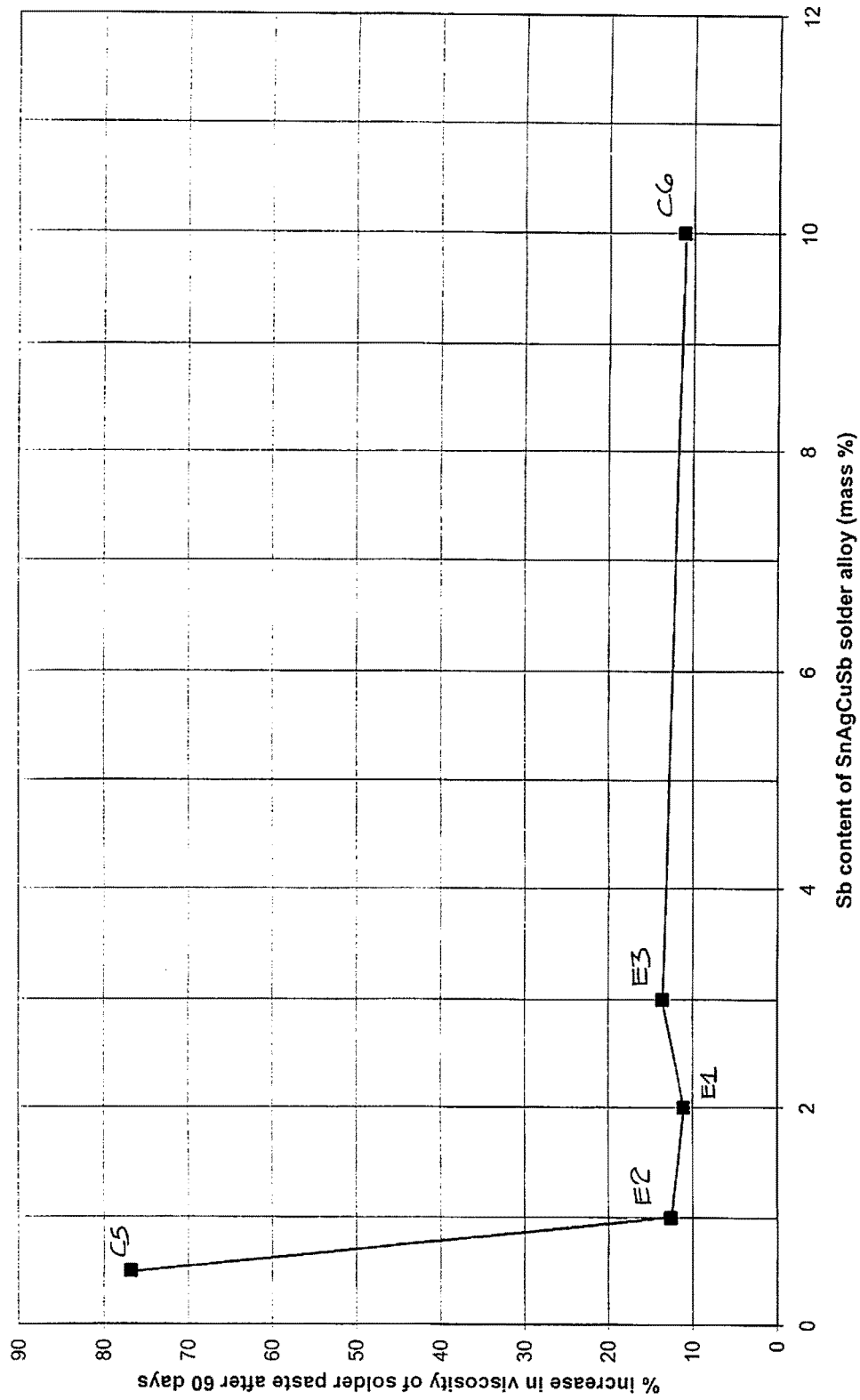

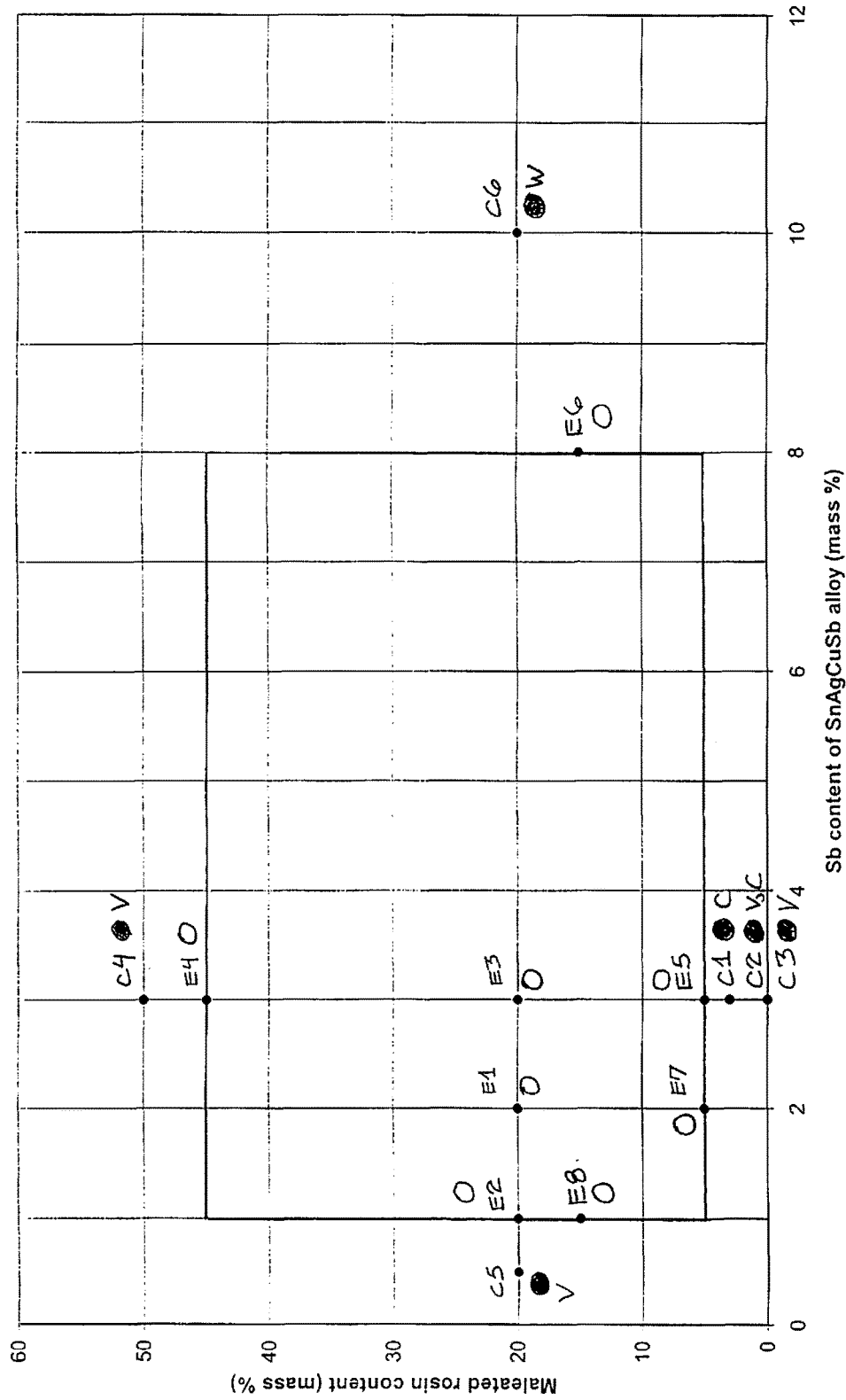
Figure 4 - Effect of Sb content and rosin content of lead-free solder paste
O = good properties  ● = poor properties:  V = high viscosity  W = poor wettability  C = dark residue

LEAD-FREE SOLDER PASTE

TECHNICAL FIELD

This invention relates to a solder paste used for soldering of electronic equipment and particularly to a Sn—Ag—Cu based lead-free solder paste.

BACKGROUND ART

Soldering methods used for electronic parts include soldering with a soldering iron, flow soldering, reflow soldering, and the like.

Soldering with a soldering iron is a soldering method in which a flux cored wire solder is placed against a portion to be soldered and the solder wire is heated and melted with a soldering iron. Soldering with a soldering iron carries out soldering at one portion to be soldered at a time, so it has problems with respect to productivity and it is not suitable for mass production.

In the flow soldering method, the surface to be soldered of a printed circuit board is contacted with molten solder to carry out soldering. It has excellent productivity in that an entire printed circuit board can be soldered in a single operation. However, in the flow soldering method, with electronic parts having a narrow pitch, bridges may be formed in which solder straddles the parts and adheres thereto, and molten solder directly contacts electronic parts, and when the electronic parts have low resistance to heat, the electronic parts sometimes underwent thermal damage and had a deterioration in function. In addition, if connecting members such as connectors are mounted on the surface to be soldered of a printed circuit board, there is the problem that molten solder penetrates into holes in the connectors and they can no longer be used.

The reflow soldering method is a method in which a solder paste comprising solder powder and a flux is applied just to necessary locations on a printed circuit board by printing or dispensing, electronic parts are mounted on the portions where the solder paste was applied, and then the solder paste is melted in a heating apparatus such as a reflow furnace to solder the electronic parts to the printed circuit board. In the reflow method, not only is it possible to perform soldering of many locations in one operation, but there is no occurrence of bridging even with electronic parts having a narrow pitch, and solder does not adhere to unnecessary locations, so soldering can be carried out with excellent productivity and reliability.

In recent years, miniaturization of electronic equipment is progressing, and electronic parts mounted on printed circuit boards are being reduced in size. Therefore, printed circuit boards which are too fine to be soldered by flow soldering are increasing in number, and there is an increasing shift from flow soldering, which was conventionally used, towards reflow soldering.

Solder paste which has been used in the reflow soldering method from in the past has been one in which solder powder was a Pb—Sn alloy. This Pb—Sn alloy has a melting point of 183° C. with a eutectic composition (Pb—63Sn), it has little thermal effect even on electronic parts having low heat resistance, and it has excellent solderability, so it has the advantages that it produces few soldering defects such as unsoldered portions or dewetting. When electronic equipment which was soldered using a solder paste using this Pb—Sn alloy becomes old or malfunctions, it is discarded without being upgraded or repaired. When printed circuit boards are discarded, they have been disposed of by burial instead of incineration. Disposal is carried out by burial because solder is metallically adhered to the copper foil of printed circuit boards, and it is not possible to separate the copper foil and the solder and reuse them. If printed circuit boards which are disposed of by burial are contacted by acid rain, Pb in the solder is dissolved out and pollutes underground water. If humans or livestock drink underground water containing Pb for long periods of time, they may suffer lead poisoning. Therefore, there is a strong demand from the electronic equipment industry for so-called lead-free solders which do not contain Pb.

Lead-free solder has Sn as a main component, and currently-used lead-free solders are binary alloys such as Sn—3.5Ag (melting point of 221° C.), Sn—0.7Cu (melting point of 227° C.), Sn—9Zn (melting point of 199° C.), and Sn—58Bi (melting point of 139° C.), as well as those to which a third element such as Ag, Cu, Zn, Al, Bi, In, Sb, Ni, Cr, Co, Fe, Mn, P, Ge, and Ga is suitably added. In the present invention, "based" means an alloy itself or an alloy based on a binary alloy to which at least one additional element is added. For example, a Sn—Zn based alloy means a Sn—Zn alloy itself or an alloy having at least one of the above-mentioned additional elements added to Sn—Zn, and a Sn—Ag based alloy is a Sn—Ag alloy itself or an alloy to which at least one of the above-described third elements is added to Sn—Ag.

Among these lead-free solders, a Sn—Ag based solder composition and particularly a Sn—Ag—Cu based solder composition in which 0.5-1.0% of Cu is added to a Sn—Ag based solder composition is currently most widely used because it is convenient from the standpoint of the melting temperature of the solder and the reliability of heat cycling properties of the solder. The present applicant disclosed a Sn—Ag—Cu based lead-free solder made from an alloy having a composition containing greater than 3.0 and at most 5.0 weight percent of Ag, 0.5-3.0 weight percent of Cu, and a remainder of Sn and which forms soldered portions having excellent thermal fatigue properties, and a Sn—Ag—Cu—Sb based lead-free solder further containing at most 5 mass percent of Sb (JP 5-50286 A, referred to as Patent Document 1). However, in contrast to a conventional Sn—Pb solder, a lead-free solder such as a Sn—Ag—Cu based lead-free solder does not contain Pb which has low reactivity with flux components, so it has high reactivity with flux components. Accordingly, a solder paste made of this lead-free solder needs a special flux for lead-free solders having low reactivity with solder powder.

As electronic equipment becomes smaller, locations for soldering on printed circuit boards are becoming finer, but a space between mounted substrates is becoming smaller, and cleaning of printed circuit boards is becoming difficult. Accordingly, mounting atop printed circuit boards with solder paste is often being carried out using no-clean solder paste instead of water-soluble solder pastes, which always need cleaning.

There are three requirements of solder paste for carrying out mounting on printed circuit boards without cleaning.

First, flux residue after reflow must be non-tacky. If flux residue on a printed circuit board after reflow is tacky, dust or dirt in the air adheres to the flux residue and sometimes causes insulating defects such as leaks.

Second, the color of the flux residue on a printed circuit board after reflow should be light and not prominent. The reason for the second requirement that the flux residue after reflow have a light color and should be close to transparent is that in a final step, soldered portions undergo visual inspection, and if the flux residue has a dark color, erroneous inspection can easily take place and when the printed circuit board is observed by the user at the time of repair or the like, if the color is too dark it presents a poor image.

The third requirement is that flux residue should have good adhesion to the silicone resin or acrylic resin. This is because is that conformal coating is carried out in a printed circuit board for electronic parts with a silicon resin or an acrylic resin, It is conceivable to use a maleated rosin or a hydrogenated rosin which are rosins as flux of a paste which has flux residue after reflow with a light color which is close to transparent. JP 9-52191 A (referred to as Patent Document 2) discloses a maleated rosin or a hydrogenated rosin as a flux for a solder paste. These prior art documents concern solder paste which uses Sn—Pb solder powder which are all solder powders having low reactivity, and there is no combination with lead-free solder.

Patent Document 1: JP 5-50286 A
Patent Document 2: JP 9-52191 A

DISCLOSURE OF INVENTION

Lead-free solders such as Sn—Ag—Cu based lead-free solders differ from conventional Sn—Pb solders in that they do not contain Pb which has low reactivity with flux components, so its reactivity with flux components is high. Accordingly, a solder paste of a lead-free solder needs a special flux for lead-free solder having low reactivity with solder powder. A maleated rosin which is a rosin having a transparent color has the excellent properties that it has a high softening point and flux residue after reflow is not tacky, but it has a high acid value, and if it is used in a flux for lead-free solder, it has the problems that the solder powder and the resin react and the solder paste changes over time, its viscosity can easily increase, and the pot life of the solder paste is short.

The object of the present invention is to find a solder powder for use in a solder paste which has little change in the solder powder over time even when it uses a flux using a maleated rosin as the main resin of a flux of a solder paste which results in a transparent, non-tacky residue with a high softening point after reflow.

The present inventors found that in a solder paste formed by mixing a flux for a solder paste containing at least 5 mass % of a maleated rosin with a Sn—Ag—Cu based lead-free solder powder, by adding 1-8 mass % of Sb to the Sn—Ag—Cu based lead-free solder powder, a reaction between the solder powder and the flux containing a maleated rosin is suppressed and a long pot life for the solder paste is achieved, and they completed the present invention.

A solder paste used in reflow soldering mixes nearly equal volumes of solder is powder and a flux for solder paste, so a solder paste which uses a resin such as rosin as the main component of the flux for the solder paste is referred to as a rosin-based solder paste, and one which uses a water-soluble resin is referred to as water-soluble paste. With a water-soluble paste, if residue is not cleaned up after reflow, the residue easily absorbs moisture, and active components in the residue react with water and ionize and cause corrosion and a decrease in the insulation resistance of a printed circuit board. In contrast, with a rosin-based flux, rosin contained in residue after reflow prevents absorption of moisture, and it does not react with active components in the residue. Accordingly, even if a rosin-based solder paste is not cleaned off, it does not produce corrosion or a decrease in the insulation resistance of a printed circuit board.

The properties of residue of a rosin-based solder paste are due in large part to the rosin component which is the largest proportion of solids in a flux for a solder paste.

Rosin is a natural resin taken from sap of pine trees or the like. It is used primarily for sizing in paper manufacture, and as a raw material for paint and printing ink. Natural rosin is an organic acid mixture of abietic acid or the like, but when it is used as a raw material for sizing in paper making, paint, or printing ink, in order to suppress the tackiness of the resin, double bonds contained in an organic acid such as abietic acid are replaced by hydrogen or other components, so it does not have the tackiness of the natural rosin. Such a rosin is referred to as a synthetic rosin.

Synthetic rosins include polymerized rosins, phenol modified rosins, maleated rosins (maleic acid-modified rosins), and hydrogenated rosins. Maleated rosins and hydrogenated rosins have the characteristic that their color is close to transparent.

However, when using rosin as a component of flux for soldering, if double bonds contained in organic acids such as abietic acid are all replaced by hydrogen or other components with the object of preventing tackiness, the solderability of the rosin itself is eliminated. In addition, if all the double bonds contained in an organic acid in rosins such as abietic acid are replaced by hydrogen or other components, the resulting rosin can no longer be dissolved in alcohol solvents or glycol ether based solvents used in flux for solder pastes, rosin precipitates, and a paste cannot be formed at all. Instead of a paste, a dry and crumbling solid is formed. Accordingly, when rosin is used as a component in flux for soldering, it is necessary to avoid replacing all the double bonds contained in an organic acid such as abietic acid in rosin and to leave a portion thereof unchanged.

Among synthetic rosins, a hydrogenated rosin has a transparent outer appearance and is not tacky, so it satisfies the two requirements of a no-clean solder paste that the color of flux residue after reflow is light and close to transparent and that the flux residue after reflow is not tacky. However, the double bonds contained in an organic acid such as abietic acid in the rosin are replaced by hydrogen, so a hydrogenated rosin has poor solubility in alcohol solvents, glycol ether based solvents, or the like. Therefore, if a large amount thereof is added to a flux for a solder paste, the hydrogenated rosin precipitates from the solder paste and easily produces a change with the passage of time. Accordingly, the added amount of a hydrogenated rosin needs to be at most 20 mass percent of a flux for solder paste. Even in this case, the addition of a hydrogenated rosin improves the external appearance, but it worsens solderability, so the content is more preferably at most 5 mass percent.

In contrast, a maleated rosin is a synthetic rosin formed by reacting rosin and maleic anhydride, and maleic anhydride bonds to the double bonds contained in an acid such as abietic acid in the rosin, so not all of the double bonds are replaced by maleic anhydride, and double bonds contained in an organic acid such as abietic acid remain after synthesis. Accordingly, it has a high acid value and good solderability. Furthermore, compared to the softening point of approximately 80° C. of a synthetic rosin, the softening point of a maleated rosin is a high value of 130° C., so residue after reflow is not tacky.

However, the problem is that the acid value of a maleated rosin is high, and whereas the acid value of a polymerized rosin which is used as a rosin component of flux for typical solder paste is around 160 (mg KOH/g), it is around 230 (mg KOH/g) for a maleated rosin. Therefore, a maleated rosin has the drawback that it easily reacts with solder powder. Among transparent rosins, a hydrogenated rosin has a low acid value of 10 (mg KOH/g), and its reactivity with solder powder is low, but it has the problem that its solderability is low. In this manner, the fact that its acid value is high is the cause of the defect that a large amount of a maleated rosin cannot be added when it is used as a flux for lead-free solder even though a maleated rosin has a transparent appearance and is not tacky, so it satisfies the two requirements that flux residue after reflow has a light color and is close to transparent and that flux residue after reflow is not tacky.

The present invention suppresses a reaction between solder powder and a flux for a solder paste by selecting the composition of a solder alloy based on the reactivity with solder powder of a flux for a solder paste. A rosin salt of Sn is formed by a reaction between a Sn—Ag based solder powder or a Sn—Ag—Cu based solder powder with a maleated rosin. By adding 2-10 mass % of Sb to a Sn—Ag based solder or a Sn—Ag—Cu based solder, a reaction between solder powder and a flux containing a maleated rosin is suppressed.

This is thought to be because a reaction between solder powder and a maleated rosin proceeds slowly due to formation of $SbO_2$ or $Ag_3SnSb$, which has relatively low reactivity, on the surface of a Sn—Ag based solder powder or a Sn—Ag—Cu based solder powder, although $SnO_2$ or $Ag_3Sn$ or the like are also formed on the surface of the solder powder.

In a conventional lead-free solder paste, even if it is attempted to use a maleated rosin as a rosin for a lead-free solder paste, it has a high acid value, so there are the defects that the solder powder and the resin react and produce a change in the solder paste over time, the viscosity can easily increase, and the pot life of the solder paste is short.

By using a solder paste according to the present invention, it is possible to obtain flux residue with the excellent properties that the color of flux residue on a printed circuit board after reflow is transparent and does not stand out, and the flux residue after reflow is not tacky.

In addition, it has the excellent effects that change over time in the solder paste does not easily take place and it has a long pot life.

BEST MODE FOR CARRYING OUT THE INVENTION

If the Sb content of a Sn—Ag—Sb alloy powder or a Sn—Ag—Cu—Sb alloy powder according to the present invention is less than 1 mass %, there is no effect of suppressing a reaction with a maleated rosin, while if the Sb content is greater than 8 mass %, solder wettability which is an advantage of a Sn—Ag solder or a Sn—Ag—Cu solder is impaired. Accordingly, the amount of Sb added to a Sn—Ag solder powder or a Sn—Ag—Cu solder powder according to the present invention is preferably 1-8 mass % and more preferably 2-5 mass %.

According to the present invention, there is no direct relationship between the contents of Ag and Cu in a Sn—Ag—Sb alloy powder or a Sn—Ag—Cu—Sb alloy powder and the reactivity with a maleated rosin. Accordingly, from a technical standpoint, there is no particular need to limit the contents of Ag and Cu in a Sn—Ag—Sb alloy powder or a Sn—Ag—Cu—Sb alloy powder according to the present invention, and in a Sn—Ag—Cu—Sb alloy, selecting Ag to be 1.0-4.0 mass % and Cu to be 0.4-1.0 mass % provides a solder with excellent tensile strength and creep properties. More preferably, Ag is 3.0-4.0 mass % and Cu is 0.5-0.7 mass %. Furthermore, if at least one transition metal from the iron group such as Ni, Co, and Fe is added in a total amount of at most 0.5 mass %, an improvement in the strength of the solder alloy composition is observed.

The content of a maleated rosin in a flux for a solder paste according to the present invention is at least 5 mass % and at most 45 mass % of the flux. If the content of a maleated rosin contained in a flux for a solder paste is less than 5 mass %, there is little change over time in a solder paste even with a conventional Sn—Ag alloy powder or a Sn—Ag—Cu alloy powder, and there is no particular need to add Sb. If a maleated rosin is added in excess of 45 mass % of a flux for a solder paste, even if a Sn—Ag—Sb alloy powder or a Sn—Ag—Cu—Sb alloy powder is used, it is not possible to suppress changes with the passage of time. Accordingly, the content of a maleated rosin contained in a preferred flux for a solder paste according to the present invention is at least 5 mass % and at most 45 mass %. More preferably, it is at least 5 mass % and at most 20 mass %.

The present invention realizes a solder paste having little change over time and a long pot life even when a flux for a solder paste contains a maleated rosin by adding Sb, which has low reactivity with a maleated rosin, to a conventional Sn—Ag alloy powder or a Sn—Ag—Cu alloy powder.

Accordingly, it is preferable to limit the content of components having high reactivity with solder powder other than a maleated rosin. Such components in flux having high reactivity with solder powder are hydrogen halide salts such as diphenylguanidine HBr. A hydrogen halide salt contained in a flux for a solder paste according to the present invention preferably has a content of less than 2 mass % of the flux. If the content of the hydrogen halide salt contained in a flux is at least 2 mass %, a reaction between the alloy powder and the flux progresses even when Sb is added, and the effects of the present invention are not realized. In the present invention, is it possible to add at most 3 mass % of an organic halogen compound such as hexabromocyclododecane, trans-2,3-dibromo-2-butene-1,4-diol, 2,3-dibromo-1, 4-butanediol, 2,3-dibromo-1-propanol, or 1,3-dibromo-2-propanol as an auxiliary activator.

Example 1

Examples of a flux according to the present invention and comparative examples were prepared using a maleated rosin, a polymerized rosin, a hydrogenated rosin, and a phenol modified rosin. The composition of the flux is shown in Table 1.

The method of manufacturing flux was to add each rosin to a solvent, perform heating to melt the rosin, then stop heating and cool to around 100° C. When the liquid temperature reached around 100° C., a thixotropic agent was added and melted, and then an activator was added and was dissolved while stirring. After all of the materials had dissolved, the flux was cooled to solidify it by water cooling or the like.

TABLE 1

| Function | Details | Flux in examples (mass %) | | | | Flux in comparative examples (mass %) | | | |
|---|---|---|---|---|---|---|---|---|---|
| | | 1 | 2 | 3 | 4 | 1 | 2 | 3 | 4 |
| Rosin | Maleated rosin | 20 | 45 | 15 | 5 | 3 | — | — | 50 |
| | Polymerized rosin | 30 | — | 20 | 30 | 30 | 30 | 30 | — |
| | Hydrogenated rosin | 5 | 5 | 20 | 10 | 10 | | 20 | — |
| | Phenol modified rosin | — | — | — | 12 | 15 | 30 | 10 | — |
| Activator | Diphenyl-guanidine HBr | 0.5 | 0.5 | 0.5 | 0.5 | 0.5 | 0.5 | 0.5 | 0.5 |
| | 2,3-dibromo-1,4-butanediol | 0.5 | 0.5 | 0.5 | 0.5 | 0.5 | 0.5 | 0.5 | 0.5 |
| | Adipic acid | 0.5 | 0.5 | 0.5 | 0.5 | 0.5 | 0.5 | 0.5 | 0.5 |
| Thixotropic agent | Hydrogenated castor oil | 4 | 4 | 4 | 4 | 4 | 4 | 4 | 4 |
| | Ethylene-bisstearamide | 1 | 1 | 1 | 1 | 1 | 1 | 1 | 1 |
| Solvent | Diethylene glycol monohexyl ether | 38.5 | 43.5 | 38.5 | 36.5 | 35.5 | 33.5 | 33.5 | 43.5 |

Example 2

Sn—Ag based solder powders and the fluxes prepared in Example 1 were mixed in the proportions shown in Table 2 to prepare a solder paste. The flux content of each solder paste was a reference value of 10.5 mass %, and the flux content was adjusted until the viscosity was around 200 Pa-sec.

Each solder paste was left at room temperature for one day, and then its viscosity was measured. In addition, each solder paste was stored for 60 days in a constant temperature storage chamber set to 25° C., and then its viscosity was measured. Viscosity was measured based on the method set forth in JIS Z 3284 Appendix 6 using a PCU-205 manufactured by Malcom Co., Ltd. The results are shown in Table 2.

The change over time in each solder paste was compared and the pot life was determined.

Example 3

The wettability and the color of the residue of the solder pastes manufactured in Example 2 were compared.

Wettability of the solder paste was measured by the method set forth in JIS Z 3284, Appendix 10.

The temperature of the solder bath was measured as 250±3° C.

In the same manner as in JIS Z 3284, Appendix 10, the color of the residue of the solder paste was determined by printing solder paste using a metal mask with a thickness of 0.2 mm and holes with a diameter of 6.5 mm on a tough pitch copper plate measuring 5.0 mm×5.0 mm×0.5 mm and then performing reflow using a solder bath at a temperature of 250±3° C. The color of the flux residue after cooling was compared. The results are shown in Table 2.

Summarizing the above, solder powder of an alloy having at least 1 mass % of Sb added to a Sn—Ag alloy or a Sn—Ag—Cu alloy had the effect of suppressing changes in viscosity when using a maleated rosin. However, when the Sb content is less than 1 mass %, it is not possible to suppress a change in viscosity, and when Sb is added in excess of 8 mass %, wettability of solder paste is inhibited.

In addition, if the content of a maleated rosin in a solder paste according to the present invention exceeds 45 mass %, even if Sb is added, a change in the viscosity of the solder paste cannot be suppressed. A suitable amount of a maleated rosin in a solder paste according to the present invention is at least 5 mass % and at most 45 mass %.

TABLE 2

| | | Flux (mass %) | | Solder powder composition (mass %) | | | | | Viscosity (Pa-S) | | Wettability test | Color of |
|---|---|---|---|---|---|---|---|---|---|---|---|---|
| | | Type | Content | Sn | Ag | Cu | Sb | Other | Day 1 | Day 60 | (category) | residue |
| Examples | 1 | Ex. 1 | 10.5 | rem. | 3.5 | — | 2 | — | 198 | 220 | 2 | Transparent |
| | 2 | Ex. 1 | 10.5 | rem. | 1 | 0.7 | 1 | — | 198 | 223 | 1 | Transparent |
| | 3 | Ex. 1 | 10.5 | rem. | 3.9 | 0.6 | 3 | — | 198 | 225 | 1 | Transparent |
| | 4 | Ex. 2 | 10.5 | rem. | 3.9 | 0.6 | 3 | — | 200 | 250 | 1 | Transparent |
| | 5 | Ex. 4 | 10.5 | rem. | 3.9 | 0.6 | 3 | 0.04 Ni | 195 | 218 | 1 | Transparent |
| | 6 | Ex. 3 | 10.3 | rem. | 4 | 1 | 8 | — | 200 | 240 | 2 | Transparent |
| | 7 | Ex. 4 | 10.5 | rem. | 3 | 0.5 | 2 | 0.04 Ni | 198 | 225 | 1 | Transparent |
| | 8 | Ex. 3 | 10.3 | rem. | 3.5 | 0.7 | 1 | 0.02 Co | 195 | 240 | 1 | Transparent |
| Comparative | 1 | Comp. 1 | 10.5 | rem. | 3.9 | 0.6 | 3 | — | 198 | 220 | 2 | Dark |
| | 2 | Comp. 2 | 10.5 | rem. | 3.9 | 0.6 | 3 | — | 200 | NM* | 2 | Dark |
| | 3 | Comp. 3 | 10.5 | rem. | 3.9 | 0.6 | 3 | — | 200 | NM* | 2 | Transparent |
| | 4 | Comp. 4 | 10.3 | rem. | 3.9 | 0.6 | 3 | — | 200 | 400 | 2 | Transparent |
| | 5 | Ex. 1 | 10.5 | rem. | 3.9 | 0.6 | 0.5 | — | 198 | 350 | 1 | Transparent |
| | 6 | Ex. 1 | 10.5 | rem. | 3.9 | 0.6 | 10 | — | 198 | 220 | 3 | Transparent |

*NM: Not measurable

INDUSTRIAL APPLICABILITY

A solder paste according to the present invention is not limited to Sn—Ag alloys or Sn—Ag—Cu alloys and it can be applied not only to lead-free solder pastes of Sn—Ag alloys or Sn—Ag—Cu alloys but also to alloys in which Bi or In is added to a Sn—Ag alloy or a Sn—Ag—Cu alloy.

The invention claimed is:

1. A lead-free solder paste comprising:
   a solder alloy powder of a solder alloy consisting of 1.0-4.0 mass % of Ag, 0.4-1 mass % of Cu, 1-8 mass % of Sb, and a balance of Sn; and
   a flux which contains one or more rosins which collectively are the largest component of the flux in mass %, the flux containing 5-45 mass % of a maleated rosin.

2. A lead-free solder paste as claimed in claim 1 wherein the solder alloy powder contains 2-5 mass % of Sb.

3. A lead-free solder paste as claimed in claim 1 which has an increase in viscosity at 60 days at 25° C. after preparation of the solder paste with respect to its viscosity one day after preparation of at most 25%.

4. A lead-free solder paste as claimed in claim 1 wherein the flux consists of one or more rosins and at least one material selected from an activator, a thixotropic agent, and a solvent.

5. A lead-free solder paste as claimed in claim 4 wherein the flux contains a total of at least 50 mass % of the one or more rosins.

6. A lead-free solder paste as claimed in claim 1 wherein the flux contains at least one rosin selected from a polymerized rosin, a hydrogenated rosin, and a phenol modified rosin.

7. A lead-free solder paste as claimed in claim 1 wherein the flux contains a hydrogenated rosin.

8. A lead-free solder paste as claimed in claim 1 which consists of the solder alloy powder and the flux.

9. A lead-free solder paste comprising:
   a solder alloy powder of a solder alloy consisting of 1.0-4.0 mass % of Ag, 0.4-1.0 mass % of Cu, 1-8 mass % of Sb, at least one of Ni, Co, and Fe in a total amount of greater than 0 to at most 0.5 mass %, and a balance of Sn; and
   a flux which contains one or more rosins which collectively are the largest component of the flux in mass %, the flux containing 5-45 mass % of a maleated rosin.

* * * * *

UNITED STATES PATENT AND TRADEMARK OFFICE
CERTIFICATE OF CORRECTION

PATENT NO. : 9,770,786 B2
APPLICATION NO. : 13/261530
DATED : September 26, 2017
INVENTOR(S) : Toyoda et al.

It is certified that error appears in the above-identified patent and that said Letters Patent is hereby corrected as shown below:

On the Title Page

Page 1, below the Abstract, delete the representative drawing in its entirety.

Page 2, left column, Line 3, change "9 Claims, 4 Drawing Sheets" to --9 Claims, No Drawings--.

In the Drawings

Delete Sheet 1 of 4 in its entirety.

Delete Sheet 2 of 4 in its entirety.

Delete Sheet 3 of 4 in its entirety.

Delete Sheet 4 of 4 in its entirety.

Signed and Sealed this
Seventh Day of November, 2017

Joseph Matal
*Performing the Functions and Duties of the*
*Under Secretary of Commerce for Intellectual Property and*
*Director of the United States Patent and Trademark Office*